(12) United States Patent
Grann et al.

(10) Patent No.: US 6,652,161 B2
(45) Date of Patent: Nov. 25, 2003

(54) OPTICAL WAVELENGTH DIVISION MULTIPLEXER AND/OR DEMULTIPLEXER MOUNTED IN A PLUGGABLE MODULE

(75) Inventors: Eric B. Grann, San Ramon, CA (US); Kenneth R. Herrity, Milpitas, CA (US)

(73) Assignee: Blaze Network Products, Inc., Pleasanton, CA (US)

( * ) Notice: Subject to any disclaimer, the term of this patent is extended or adjusted under 35 U.S.C. 154(b) by 58 days.

(21) Appl. No.: 09/805,514

(22) Filed: Mar. 12, 2001

(65) Prior Publication Data

US 2002/0018625 A1 Feb. 14, 2002

Related U.S. Application Data

(63) Continuation-in-part of application No. 09/347,490, filed on Jul. 2, 1999, now Pat. No. 6,201,908.

(51) Int. Cl.[7] .................................................. G02B 6/36
(52) U.S. Cl. ............................. 385/93; 385/47; 385/88; 385/92
(58) Field of Search .............................. 385/24, 31, 33, 385/37, 47, 88–94; 359/124, 127, 130

(56) References Cited

U.S. PATENT DOCUMENTS

| | | | | |
|---|---|---|---|---|
| 4,752,109 A | * | 6/1988 | Gordon et al. | 257/712 |
| 5,859,717 A | * | 1/1999 | Scobey et al. | 359/124 |
| 6,122,417 A | * | 9/2000 | Jayaraman et al. | 372/50 |
| 6,198,864 B1 | * | 3/2001 | Lemoff et al. | 359/124 |
| 6,406,195 B1 | * | 6/2002 | Hammond et al. | 385/33 |

* cited by examiner

*Primary Examiner*—Robert H. Kim
*Assistant Examiner*—Michael H Caley
(74) *Attorney, Agent, or Firm*—Bruce H. Johnsonbaugh

(57) ABSTRACT

A low profile optical wavelength division multiplexer and/or demultiplexer is provided which is carried in a pluggable module and adapted for detachable connection to a host device. The device includes a three strata optical subassembly including a substrate, a molded plastic coupling module and an optical block either connected to or integrally formed with the molded coupling module. The device can be used with either horizontally or vertically pluggable modules. The device has one embodiment capable of mounting in a GBIC compliant module.

8 Claims, 8 Drawing Sheets

OPTICAL WAVELENGTH DIVISION MULTIPLEXER AND/OR DEMULTIPLEXER MOUNTED IN A PLUGGABLE MODULE

CROSS-REFERENCE TO RELATED APPLICATION

This is a continuation-in-part of U.S. patent application Ser. No. 09/347,490 filed Jul. 2, 1999, now U.S. Pat. No. 6,201,908.

BACKGROUND AND BRIEF SUMMARY OF THE INVENTION

The present invention relates generally to an optical wavelength division multiplexer and/or demultiplexer having a sufficiently low profile and low power requirements to be mountable in a pluggable module; one embodiment of the invention is mounted in a GBIC compliant housing or module. The pluggable module may be configured to plug into a host device either vertically or horizontally. The GBIC (gigabit interface converter) specification is herein incorporated by reference as though set forth in full.

The GBIC specification defines a common form factor and electrical interface. This pluggable transceiver module allows system builders to configure fiber links as required. GBIC modules provide hot-swap interchangeability and give net administrators the ability to tailor transceiver costs, link distances and configure overall network topologies to their requirements. The use of GBIC transceiver modules also leaves the door open for changing the network without the wholesale replacement of system level boards.

The present invention provides for the first time a low profile optical wavelength division multiplexer and/or demultiplexer capable of being mounted in a pluggable or removable module; one embodiment is mountable in a GBIC compliant module. The module in its transmission mode is able to reliably convert serial and/or parallel electrical signals inside the host equipment into serial and/or parallel optical signals to be sent across fiber optic cables. On the demultiplexing or receiving end, the optical transceiver receives the optical signal and converts it back into the electrical domain for transmission into the host device. The present invention provides a pluggable module mounted optical WDM capable of recovering the original signal even if it has been distorted along the fiber transmission path.

A primary object of the invention is to provide a low profile optical wavelength division multiplexer and/or demultiplexer mounted in a pluggable module insertable into a host device.

Another object of the invention is to provide a pluggable WDM module which can be configured to be plugged into a host device either horizontally or vertically.

Another object of the invention is to provide a low profile optical wavelength division multiplexer and/or demultiplexer mounted in a GBIC compliant housing and which is hot-swappable in accordance with the GBIC specification.

A further object of the invention is to provide a pluggable WDM module having a low profile which is facilitated in part by the use of a three strata optical subassembly (OSA) which, when assembled, does not require any post-assembly optical alignment otherwise required.

A further object of the invention is to provide a horizontally or vertically pluggable WDM module having a packaging scheme for its components wherein unwanted heat is efficiently transferred to a metallic housing and into the ambient air.

Further objects and advantages of the invention will become apparent from the following description and the drawings wherein:

DETAILED DESCRIPTION OF THE DRAWINGS

Figure 1:
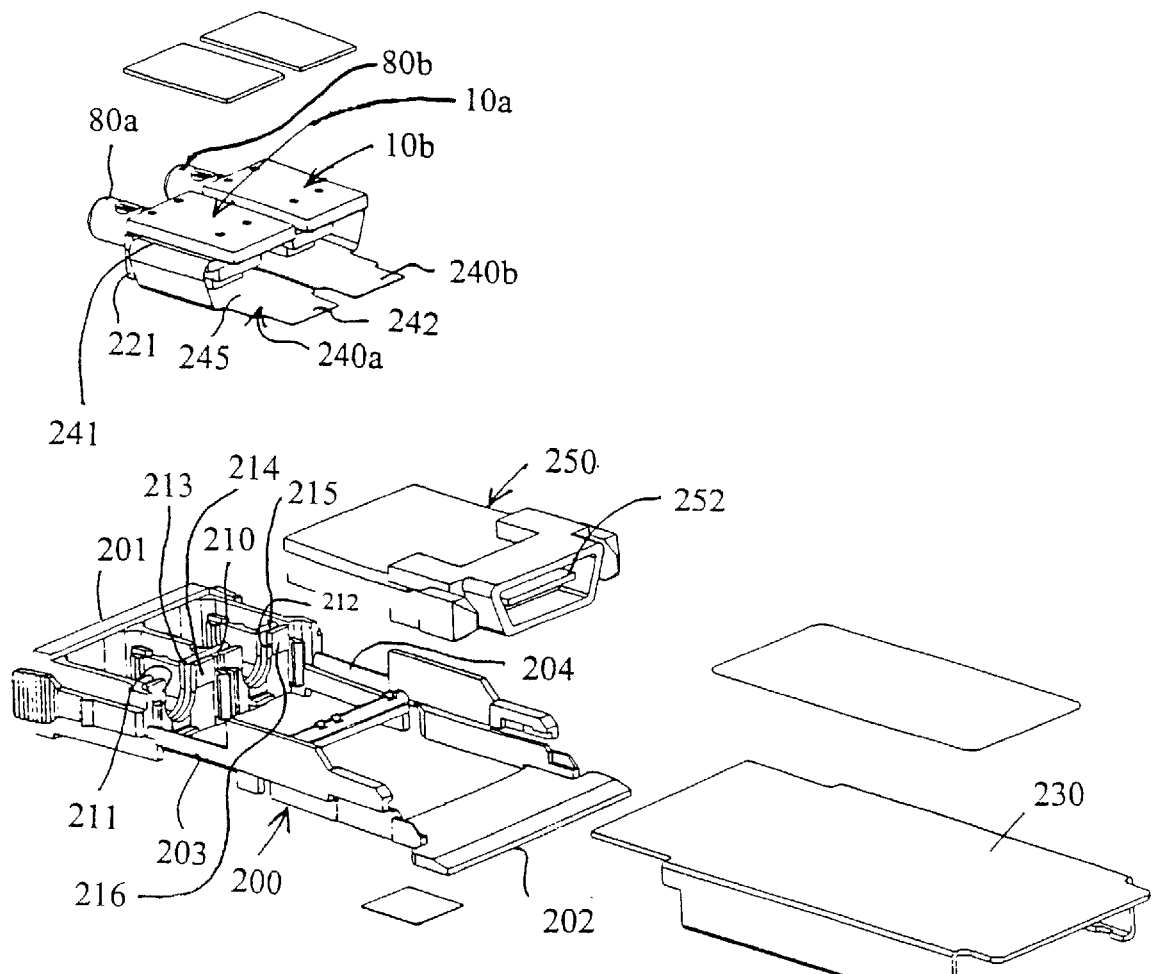
FIG. 1 is a perspective view shown in exploded fashion illustrating two optical subassemblies (a multiplexer and a demultiplexer) and how those subassemblies are mounted in a GBIC compliant, horizontally pluggable housing.
Figure 5:
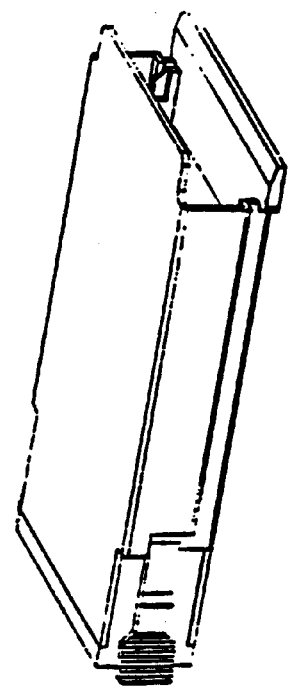
FIG. 5 is an exploded perspective view showing how a single optical subassembly (either a multiplexer or demultiplexer) may be mounted in a horizontally pluggable housing in accordance with the present invention.
Figure 5:
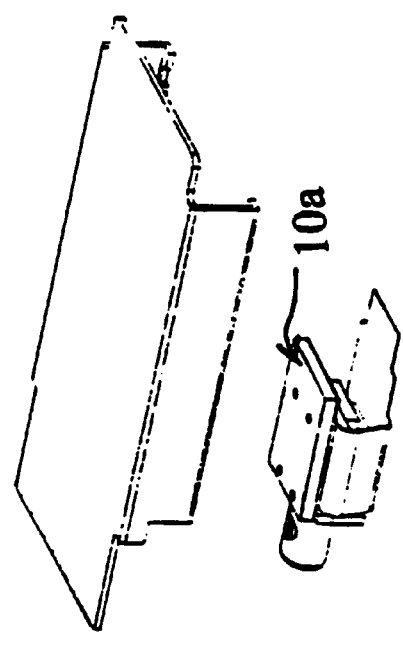
Figure 5:
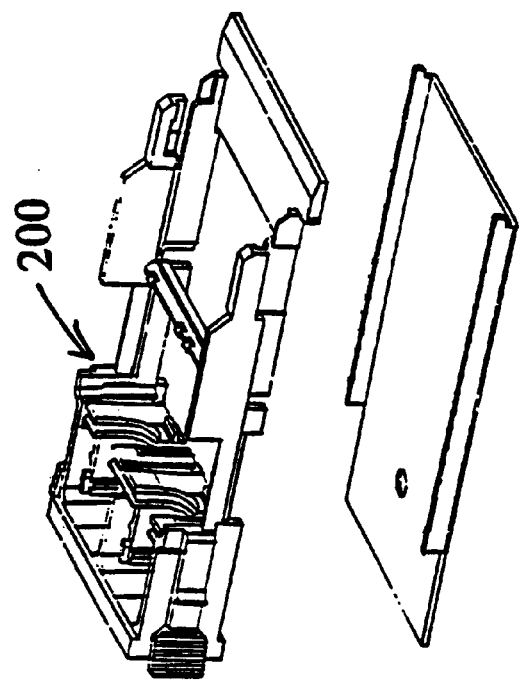
Figure 7:
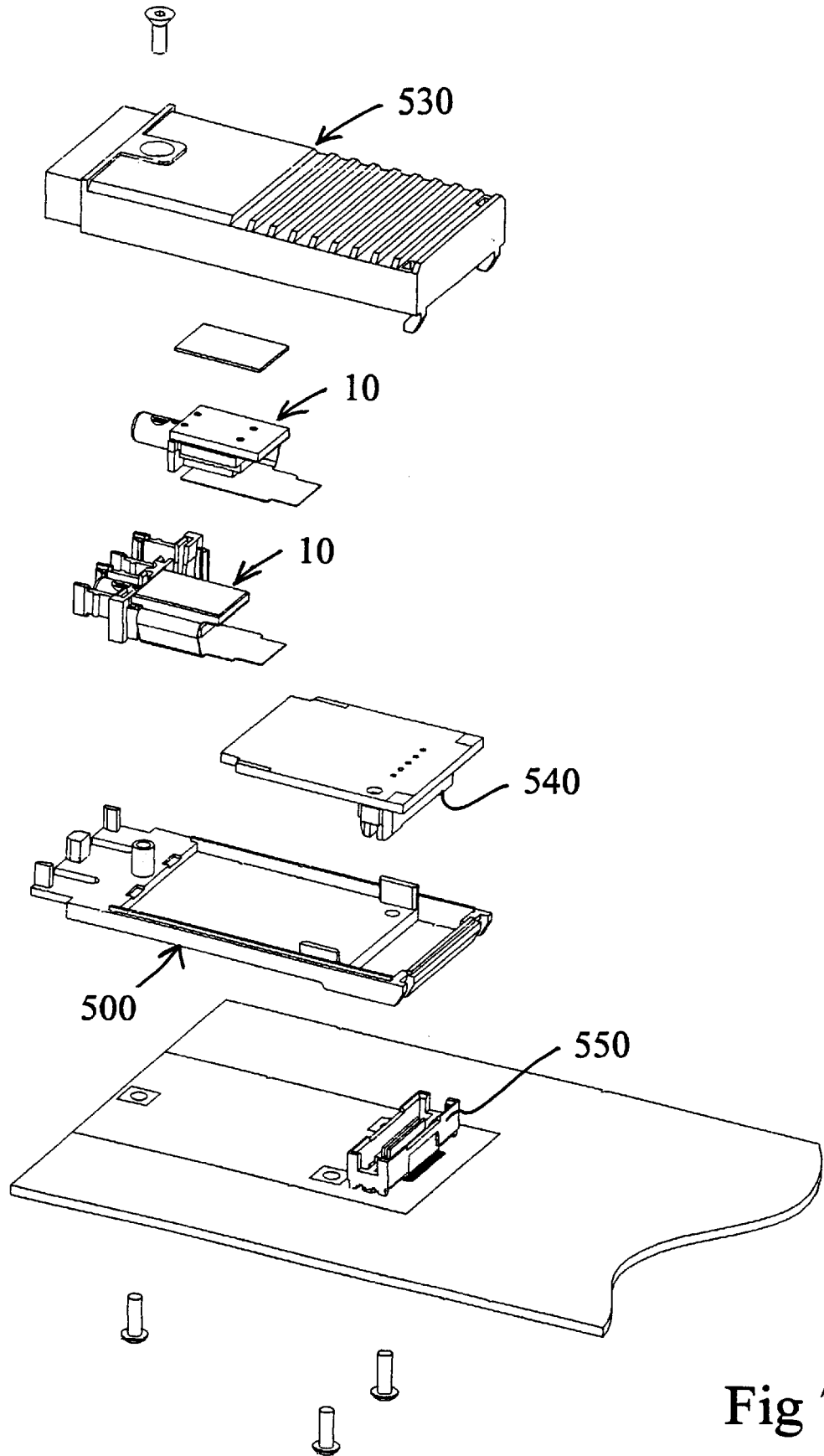
FIG. 7 is an exploded perspective view showing how a single optical subassembly (either a multiplexer or demultiplexer) may be mounted in a vertically pluggable housing in accordance with the present invention.
Figure 8:
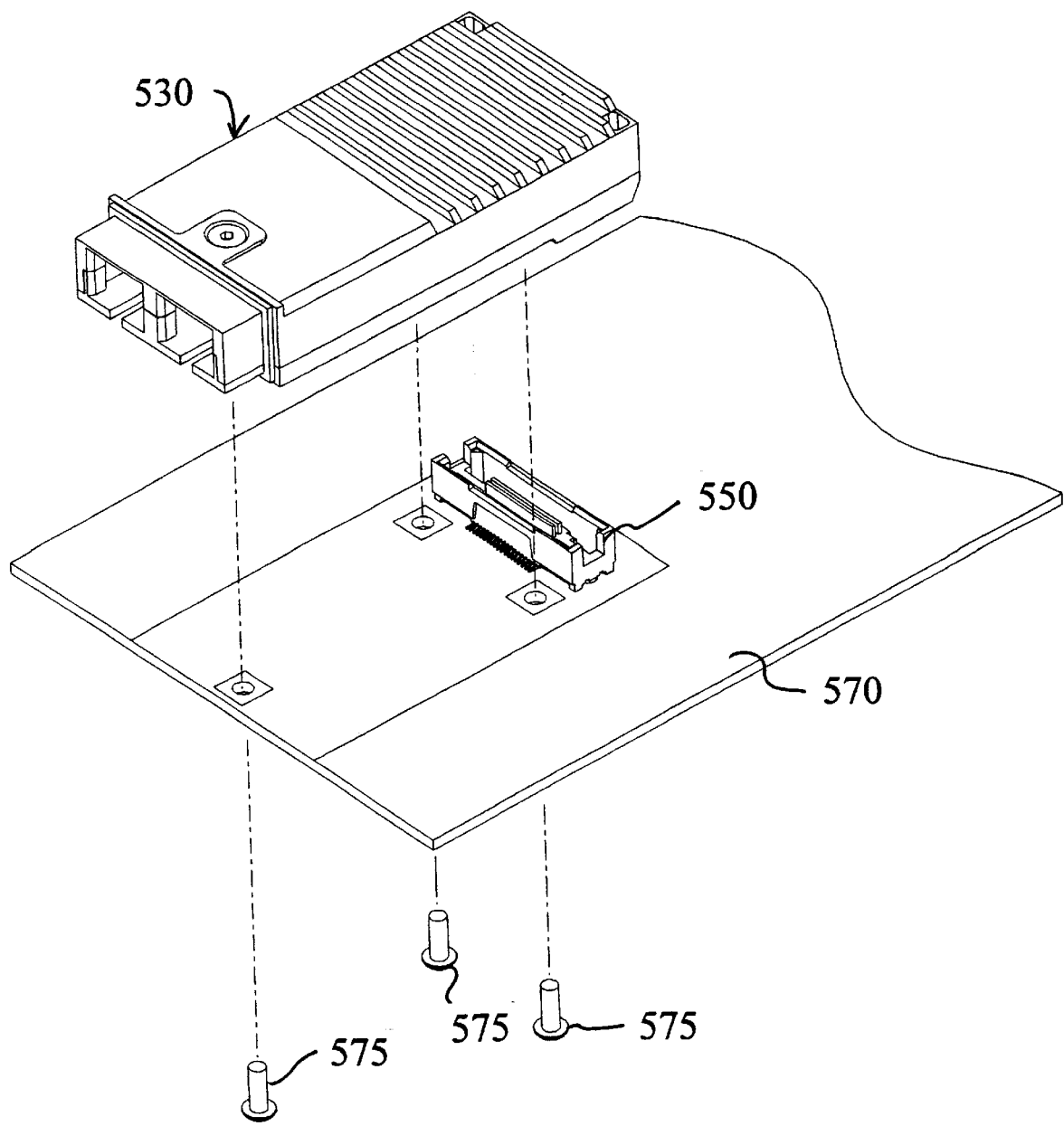
FIG. 8 is a perspective view showing the device of FIG. 7 in its assembled form, and illustrating the vertically pluggable connection to a host device.

FIG. 1 illustrates in exploded fashion how two optical subassemblies 10a and 10b are configured for ultimate packaging and secure mounting within a pluggable housing shown generally as 200 in FIG. 1 to form a pluggable module. The present invention is mountable in a variety of horizontally and vertically pluggable housings and, in one embodiment, in a GBIC pluggable housing or module. A GBIC compliant housing is shown in the drawings, but the invention is not limited thereto. As shown in FIG. 1, the OSA shown as reference numeral 10a would typically be a multiplexer and the OSA shown as reference 10b would typically be a demultiplexer. It is also within the scope of the invention that a single multiplexer or demultiplexer OSA 10 may be packaged and housed in a horizontally pluggable housing as illustrated in FIG. 5, or in a vertically pluggable housing as shown in FIGS. 7 and 8.

Each OSA (optical subassembly) 10 incorporates the basic optical pathway shown and described in parent application Ser. No. 09/347,490, incorporated herein by reference. The OSA shown in the drawings has three primary components bonded together; an optical block 20, a molded coupling module 60 and a ceramic substrate 100 (the substrate is not shown in Ser. No. 09/347,490). A more detailed description of the device shown in FIG. 3 (without ceramic substrate 100) is contained in application Ser. No. 09/347,490. A portion of that description is repeated here for convenience. The device shown in FIG. 3 has the ability to combine individual light signals into a single optical path which can be directed towards an optical fiber, and/or demultiplex such signals into individual channels. For simplicity of explanation, the demultiplexing functionality is described, since those skilled in the art will readily understand the correlative multiplexing functionality.

Figure 3:
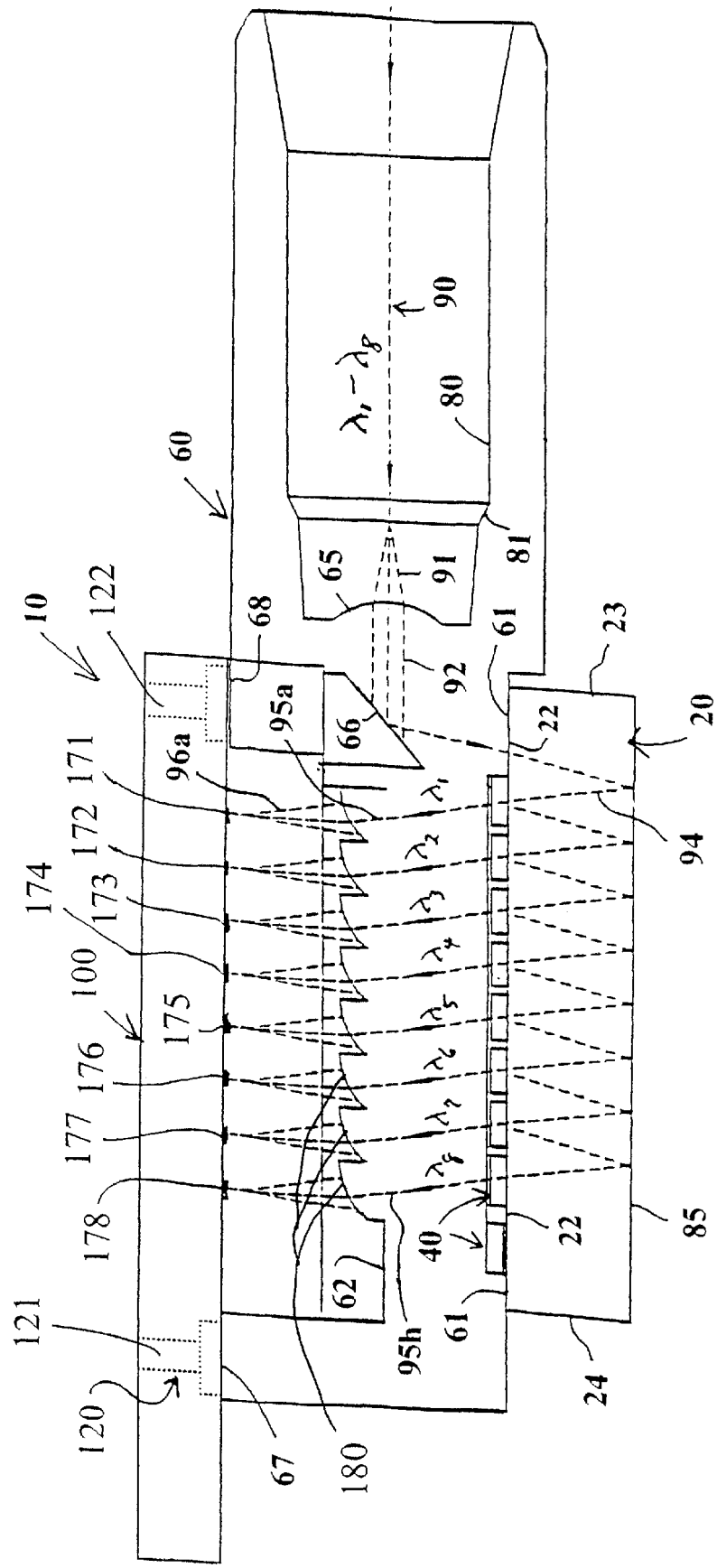
FIG. 3 is a sectional view illustrating the optical pathway through the optical subassembly and illustrating the three strata or three layered design.

FIG. 3 shows the assembled primary components and illustrates the optical pathway 90–96 wherein an incoming signal includes eight separate wavelengths (n wavelengths in the general case), which are separated into eight separate channels to be read by photodetectors 121–128. In the multiplexing mode of the invention, lasers replace photodetectors 121–128. An optical block 20 formed of glass or molded of plastic is shown with a plurality of filters 40 carried on surface 22. The optical block 20 has an outer flat surface 21 which is coated with a reflective material 85.

A molded coupling module 60 has a first flat surface 61 which is adhesively connected to the flat inner surface 22 of optical block 20.

The molded coupling module 60 in the embodiment illustrated in FIG. 3 includes a fiber optic cable receptacle 80 integrally molded therein for receiving the end of a fiber optic cable (not shown) so that the end of the cable engages receptacle seat 81.

As illustrated in FIG. 3, a multiplexed optical beam having 8 wavelengths $\lambda_1$–$\lambda_8$ moves along optical pathway 90, exits the end of the fiber optic cable (not shown) and begins to diverge as shown at 91. An integrally molded collimating lens 65 collimates the diverging light beam 91 and forms a collimated beam 92. The collimated light beam 92 is reflected off integrally formed reflective surface 66 of the molded coupling module 60 and is directed toward the reflective coating 85 carried by the flat outer surface 21 of the optical block 20. As the light beam moves through that section 93 of the optical pathway, it impinges against the reflective coating 85 at a predetermined angle of incidence. The reflected beam 94 is reflected in a zigzag pattern in optical block 20 between the plurality of n filters 40 and the reflective surface 85. As the reflected beam enters each of the n filters, one of the n different wavelengths of light is transmitted through each filter and the separated wavelengths move along the optical pathways 95a through 95h toward the plurality of molded aspheric surfaces 70 formed on second surface 62 of the molded coupling module 60. Each of the n aspheric molded surfaces focuses the separated wavelength bands or channels, as shown for example as 96a, onto separate photodetectors 121–128.

As shown in FIG. 3, the optical block 20 is generally rectangular in shape having flat outer and inner surfaces 21 and 22, a flat proximal end wall 23 and a flat distal wall 24. The optical block in the preferred embodiment of the invention is formed from a high quality optical glass. Alternately, the optical block 20 may be injection molded using high quality optical plastic. Optical block 20 may be alternately formed integrally with coupling module 60. The reflective coating 85 is applied to the outer surface 21 of block 20. The reflective coating may be formed of materials conventionally used in this art, such as dielectric interference coatings or metallic coatings.

The optical block 20 has a reflective coating on one side and an array 40 of discrete multiwavelength Fabry-Perot transmission filters on the other side. The precision optical block 20 can be formed of any transparent optical material capable of transmitting light over the desired spectral region and being formed or polished to the correct thickness. The reflective surface 85 can be placed on the optical block by a number of techniques, to include; dielectric interference coatings, metallic coatings, etc.

The plurality of n filters 40 includes eight discrete Fabry-Perot filters mounted on the flat inner surface 22 of optical block 20.

The assembly of the filter array onto the optical block and then the adhesive bonding of the optical block 20 to the molded coupling module 60 achieves a passive optical alignment of the critical optical elements of the device. When assembled as described above, the output beam 91 of the fiber optic cable is directly coupled to the wavelength division multiplexer/demultiplexer 10 and is automatically and passively aligned with the internal optics of the device, including the collimating lens 65, the beam reflection means, the reflective coating 85 on the top surface of optical block 20 as well as with the plurality of filters 40 and the plurality of aspheric surfaces 70. No postfabrication alignment or tuning or adjustment of these optical elements is required.

Figure 4:
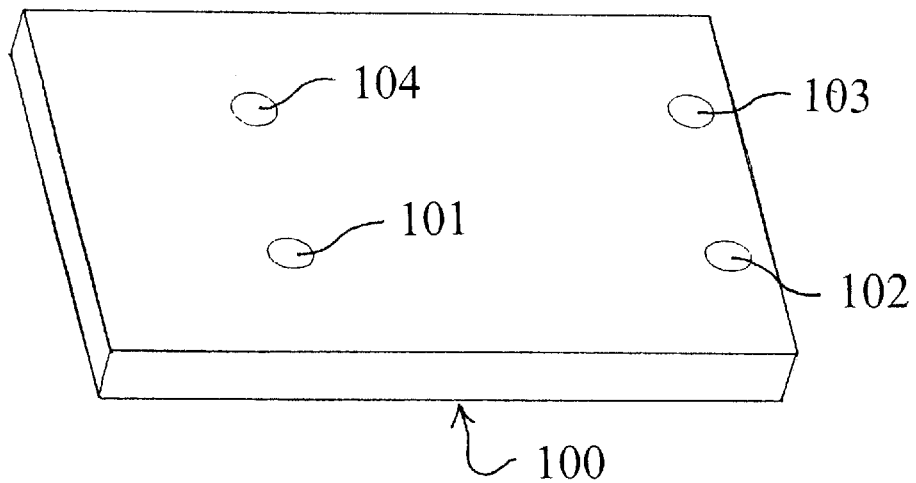
FIG. 4 is an exploded view of the optical subassembly shown in FIG. 3, showing the three strata or three separate layers of the optical sub-assembly in exploded fashion.
Figure 4:
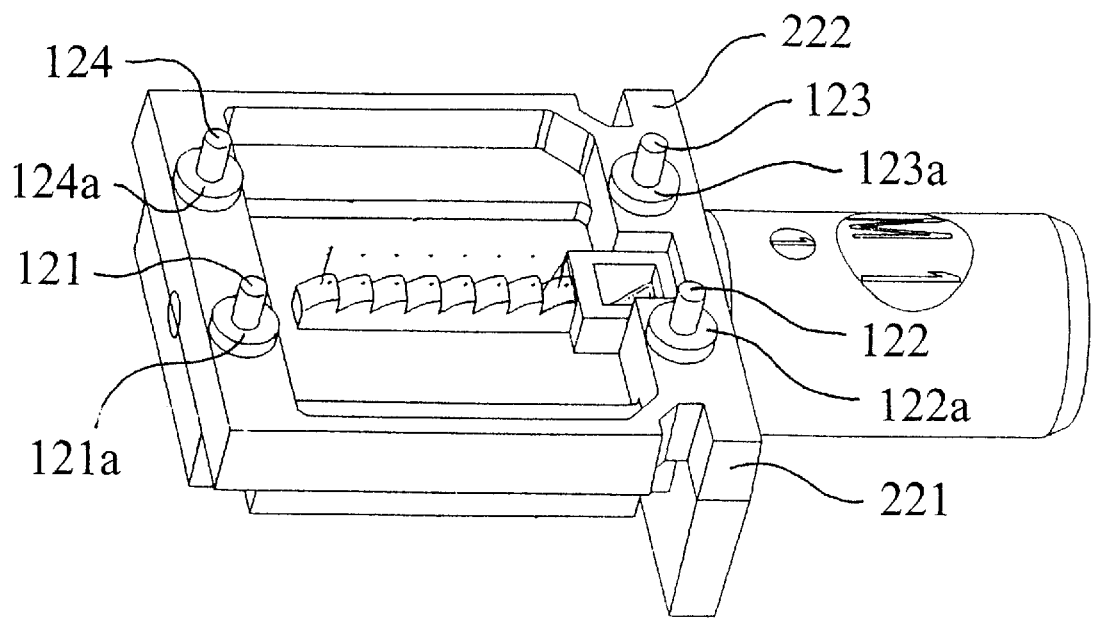
Figure 4:
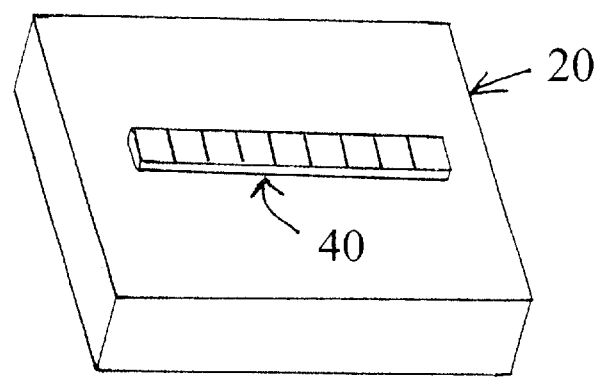

Ceramic substrate 100 is connected to first and second mounting surfaces 67 and 68 of molded coupling module 60. The preferred manner of connecting substrate 100 to module 60 is by stakes 121–124 which rigidly connect ceramic substrate 100 to molded coupling module 60 to reduce or prevent differential thermal expansion between the substrate and module. FIGS. 3 and 4 illustrate the preferred form of stakes 120 wherein four cylindrical stakes or projections 121,122,123 and 124 are integrally molded with coupling module 60. Each stake or projection 121–124 preferably includes an enlarged base 121a–124a, respectively. The purpose of enlarged bases 121a–124a is to increase the ability of each stake 121–124 to bear the shear and bending loads caused as the plastic molded coupling module 60 heats up during operation and tends to expand at a faster rate than ceramic substrate 100.

Ceramic substrate has passageways 101,102,103,104 formed therein to receive stakes or projections 121–124, respectively. Passageways 101–104 are countersunk with recesses 101a–104a (FIG. 3) to receive enlarged bases 121a–124a, respectively.

The clearance between passageways 101–104 and stakes 121–124 is preferably 25–30 microns. Epoxy 130 is the preferred adhesive used to bond the stakes 121–124 into passageways 101–104. Substrate 100 may alternately be adhesively bonded to module 60 without using stakes.

As shown in FIG. 1, two optical subassemblies 10a, 10b are adapted to be mounted in a GBIC (giga-bit interface converter) compatible housing 200 having a metallic cover 230. Ceramic substrate 100 is thermally connected to cover 230 by heat conducting adhesive, for example. The heat generated by components carried on substrate 100 is efficiently transferred to substrate 100, to metallic cover 230 and into ambient atmosphere. Efficient heat transfer in this manner improves the operating characteristics of the assembled WDM and extends its useful lifetime.

The GBIC compatible housing 200 includes a first end 201 and a second end 202. A pair of longitudinally extending side support rails 203 and 204 extend from the first end 201 to the second end 202. A transverse bulkhead 210 extends transversely from the side rails 203,204 and the bulkhead is positioned near the first end 201 of the housing 200. Bulkhead 210 includes a pair of generally U-shaped openings 211 and 212 formed in spaced apart double walls 213,214 and 215,216, respectively, which are adapted to receive optical subassemblies 10a and 10b. When the OSAs 10a and 10b are seated within bulkhead 210, the fiber optic cable receptacles 81a and 81b are positioned at the first end 201 of the housing 200 to comply with the GBIC specification. Although alternate forms of seating the OSA 10a and 10b in the bulkhead 210 may be utilized, the preferred form of attachment is a pair of ears 221 and 222 (FIG. 4) used in conjunction with double walls 213,214. In this fashion, mounting ears 221 and 222 slide downwardly between double walls 213,214. This mounting technique provides mechanical strain relief for the fiber optic receptacles 80a and 80b.

The present invention does not pertain to the optoelectronic interface between the OSAs and the host device.

Figure 2:
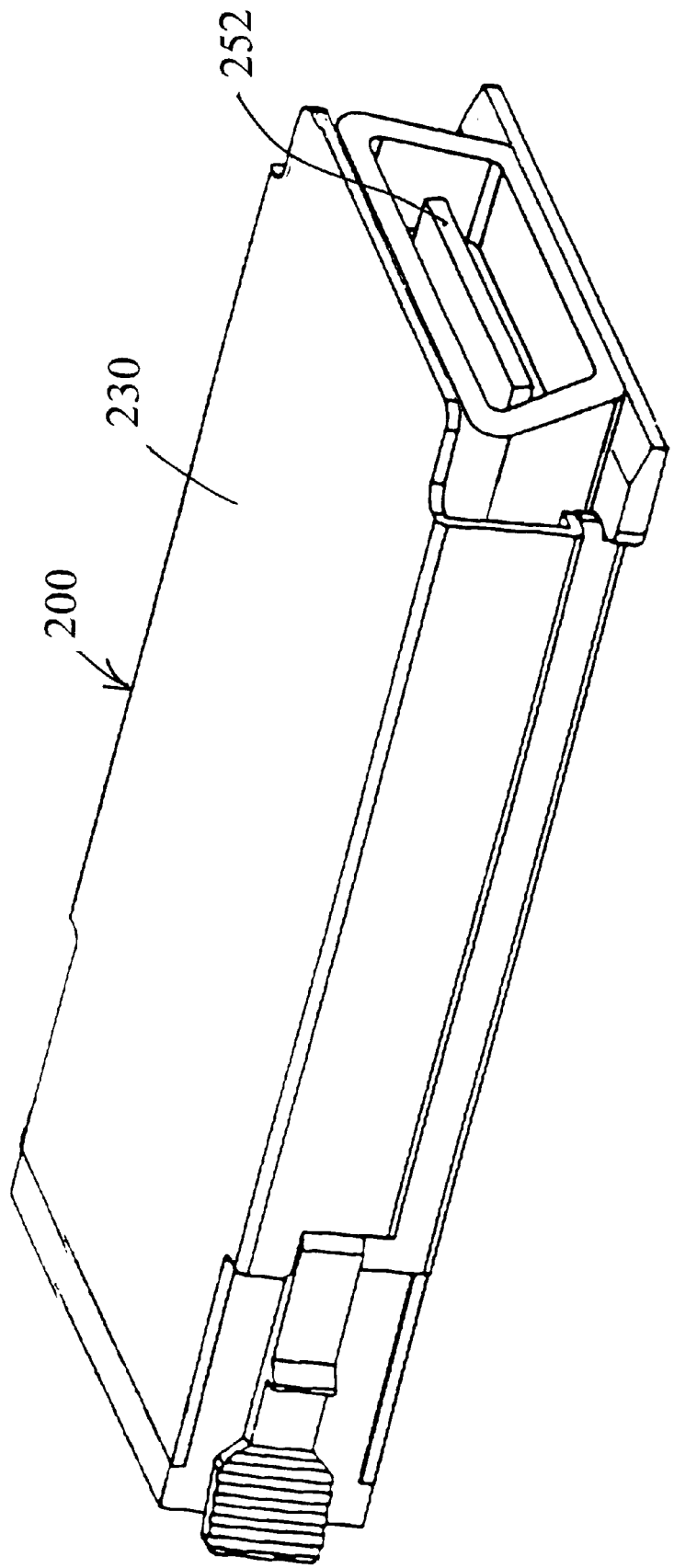
FIG. 2 is a perspective view showing the device of FIG. 1 in its assembled form and illustrating that portion of the device pluggable into a host device.

As shown in FIG. 1, flexible circuit boards 240a and 240b are provided to supply the requisite electrical connections to the active elements carried on substrate 100 of OSAs 10a and 10b, respectively. The flexible circuit boards 240a and 240b are essentially identical and only 240a will be described in the interest of brevity. Circuit board 240a includes a flexible body 245 having a first end 241 which allows necessary electrical connections to be made with the photodetectors or lasers carried by substrate 100, as well as required driver circuits carried by substrate 100. Those circuits pass along the body 245 of the flexible circuit board and extend to the tab 242 forming the rearward end of the flexible circuit board 240a. The rearward end 242 plugs into the integrated circuit support 250 which carries a chip 251 and also carries a standard GBIC host device compatible, horizontally pluggable connector 252. The connector 252 as shown best in FIG. 2 is positioned at the rearward or second end 202 of the assembled housing for the device. Connector 252 is the electrical interface between the pluggable module and the host device.

As shown in FIG. 2, the device of FIG. 1 has been assembled in a low profile GBIC compatible housing 200. The low profile is preferably achieved as described above. The packaging scheme of the present invention allows each OSA to be manufactured and tested before it is mounted in GBIC compliant housing 200. Each OSA is preferably manufactured together with its associated flexible circuit allowing each OSA to be thoroughly bench tested. Similarly, the separate mounting of each ASIC 251 on the chip mounting board 250 allows for separate testing of the ASIC.

Figure 6:
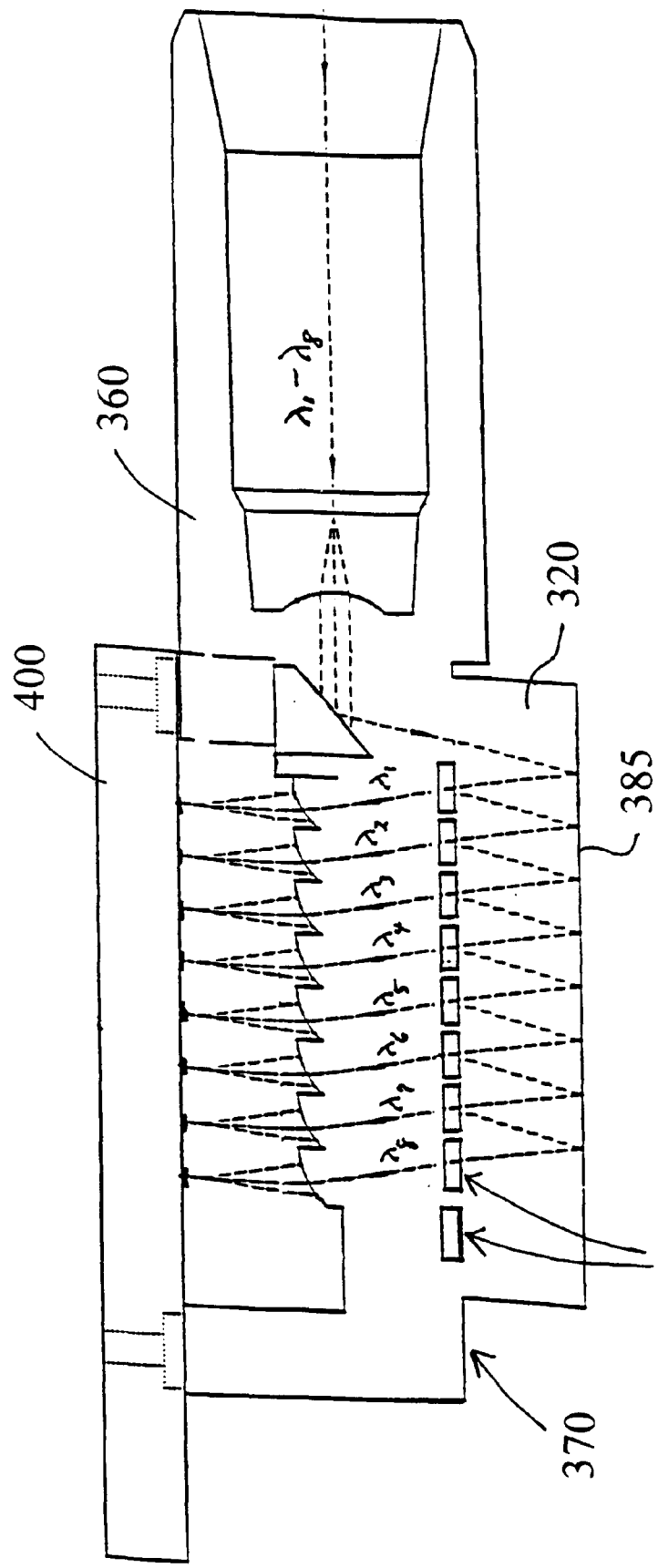
FIG. 6 is a schematic representation of an alternate embodiment wherein the optical block is integrally formed with the molded coupling module.

FIG. 6 illustrates an alternate embodiment of the invention wherein the molded coupling module 360 and optical block 320 are molded together as one integral or monolithic piece 370 wherein the plurality of filters 340 is embedded within the single molded piece 370. This embodiment has three strata, including the substrate 400, that portion of piece 370 between filters 340 and substrate 400, and that portion of piece 370 between filters 340 and reflective surface 385. The preferred embodiment is shown in FIGS. 1–5, since placement of filter array 40 may be done with greater precision on a separate optical block 20 as compared with molding piece 370 around filter array 340.

FIGS. 7 and 8 illustrate yet another alternate embodiment of the invention wherein a single optical subassembly 10 is carried in a vertically pluggable housing shown as 500 and which includes a cover 530 and a vertically extending connector 540 which is vertically plugged into a host device female receptacle 550. Connector 540 is the electrical interface between the module and the host device. The device shown in FIGS. 7 and 8 can be configured to carry a single multiplexer, or more than one multiplexer, or one multiplexer and one demultiplexer or one or more demultiplexers. All of those various configurations are within the scope of the present invention. FIG. 8 illustrates the device of FIG. 7 in its assembled form and ready to be vertically plugged into the female receptacle 550 carried by a host device support board 570. A plurality of vertically extending mounting screws 575 extend through the host device support board 570 and into the housing 500 of the device.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. A low profile optical wavelength division multiplexer and demultiplexer device wherein n channels are transmitted on n different wavelengths, and said device is carried in a pluggable module, and adapted for detachable connection to a host device, comprising:

a low profile pluggable module having first and second ends, first and second low profile optical subassemblies (OSAs) wherein said first OSA includes a fiber optic cable receptacle and a collimating lens optically coupled to said fiber optic cable receptacle, said first OSA being mounted in said pluggable module so that said fiber optic cable receptacle is positioned at said first end of said housing, means for removably plugging said pluggable module into said host device to achieve an electrical interface between said module and said host device, and wherein said first OSA has three strata including a substrate forming a first stratum, a molded plastic coupling module forming a second stratum, and an optical block forming a third stratum, said molded plastic coupling module carrying a said fiber optic cable receptacle and said collimating lens, said substrate carrying either a plurality of n lasers or n photo-detectors, said molded coupling module connected to said substrate and carrying a plurality of n lenses for either receiving light from said n lasers or focusing light on said n photodetectors, said optical block connected to or integrally formed with said molded coupling module, said optical block having a flat surface carrying a reflective coating, a plurality of n filters whereby said n channels are reflected between said reflective coating on said optical block and said plurality of n filters, and wherein each of n channels passes through one of said filters and through one of said n lens surfaces, and said three strata adapted to be connected together such that the optical elements are passively aligned with said fiber optic cable receptacle and no post-assembly alignment is required.

2. The apparatus of claim 1 wherein said second stratum and said third stratum are integrally molded together with said plurality of n filters embedded in the integrally molded piece.

3. The apparatus of claim 1 wherein each of said three strata is separately formed.

4. The apparatus of claim 1 wherein said pluggable module has a metallic cover, and wherein said substrate is thermally connected to said metallic cover to facilitate heat transfer from said substrate to said metallic cover.

5. The apparatus of claim 1 wherein said optical subassembly is adapted to be assembled and tested before being mounted in said pluggable module.

6. The apparatus of claim 1 further comprising means for horizontally plugging said pluggable module into said host device to achieve an electrical interface between said module and said host device.

7. The apparatus of claim 1 further comprising means for vertically plugging said pluggable module into said host device to achieve an electrical interface between said module and said host device.

8. The apparatus of claim 1 wherein said device is adapted to be carried in a GBIC compatible housing.

* * * * *

UNITED STATES PATENT AND TRADEMARK OFFICE
CERTIFICATE OF CORRECTION

PATENT NO. : 6,652,161 B2
DATED : November 25, 2003
INVENTOR(S) : Eric B. Grann et al.

It is certified that error appears in the above-identified patent and that said Letters Patent is hereby corrected as shown below:

<u>Column 3,</u>
Line 41, after "molded surfaces" add -- (or n lenses 180) --
Line 43, change "121-128" to -- 171-178 --

<u>Column 4,</u>
Line 33, after "recesses" delete "101a-104a (Fig. 3)"
Line 36, after "Epoxy" delete "103"

Signed and Sealed this

Twenty-third Day of March, 2004

JON W. DUDAS
*Acting Director of the United States Patent and Trademark Office*